Figure 1:
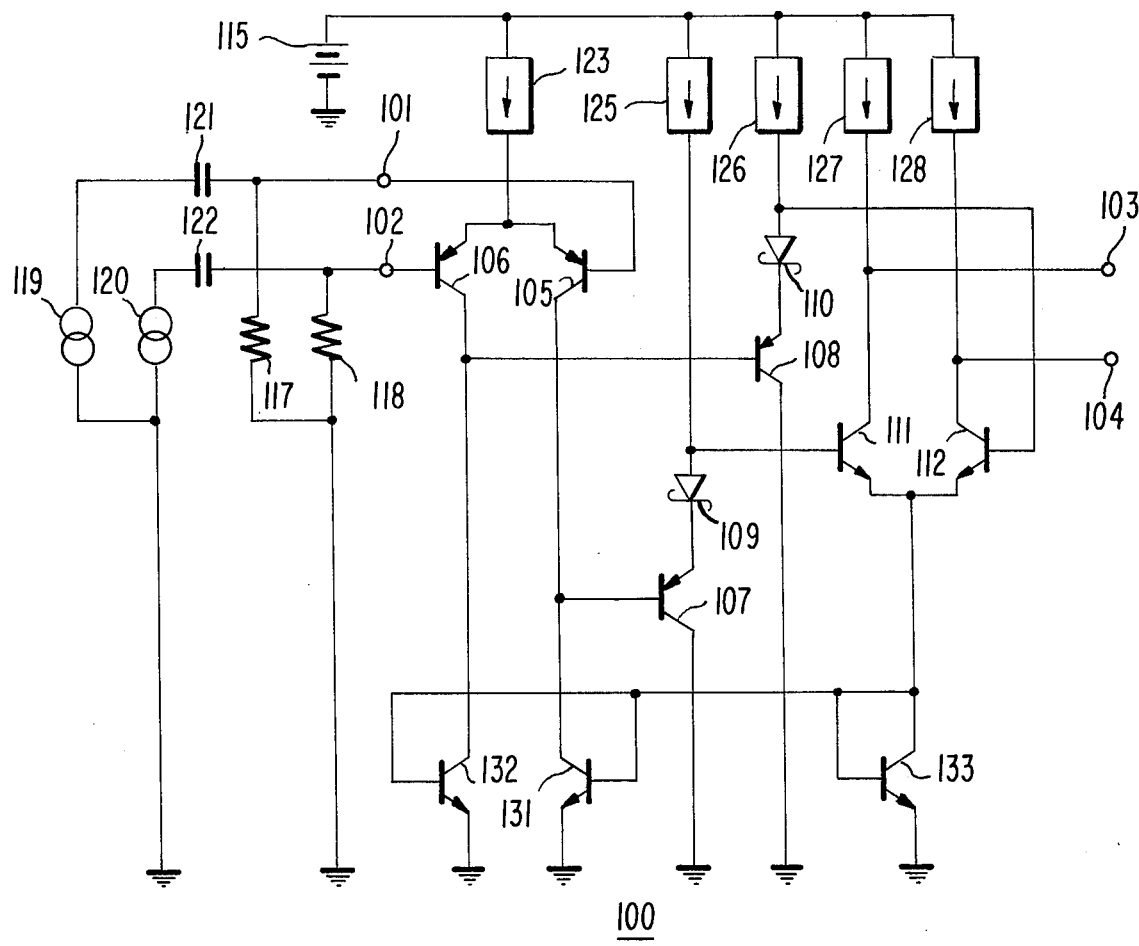

United States Patent [19]
Leidich

[11] 3,946,325
[45] Mar. 23, 1976

[54] TRANSISTOR AMPLIFIER
[75] Inventor: Arthur John Leidich, Flemington, N.J.
[73] Assignee: RCA Corporation, New York, N.Y.
[22] Filed: July 5, 1974
[21] Appl. No.: 486,243

[52] U.S. Cl. .................. 330/22; 330/17; 330/30 D; 330/40
[51] Int. Cl.² ...................... H03F 3/04; H03F 3/68
[58] Field of Search .......... 330/30 D, 69, 22, 40, 17

[56] References Cited
UNITED STATES PATENTS

| | | |
|---|---|---|
| 3,564,439 | 2/1971 | Rao.................................. 330/30 D |
| 3,760,288 | 9/1973 | Leonard............................ 330/30 D |
| R27,351 | 5/1972 | McGraw et al. .................. 330/69 X |

Primary Examiner—R. V. Rolinec
Assistant Examiner—Lawrence J. Dahl
Attorney, Agent, or Firm—H. Christoffersen; S. Cohen; A. L. Limberg

[57] ABSTRACT

A differential amplifier stage, suitable for use as the first stage in an operational amplifier with a single power supply, has the capability of its input terminals being operated over a range including one of the supply potentials. The differential amplifier stage includes a pair of emitter-coupled transistors of a first conductivity type having their base electrodes connected to input signal terminals. These transistors are each provided with an active collector load by grounded-emitter transistors of the second conductivity type connected collector-to-collector therewith. Common-mode feedback from these collector-to-collector connections to the base electrode of the grounded-emitter transistors is used to regulate the emitter-to-collector potentials of these grounded-emitter transistors to a lower value than their emitter-to-base potentials, but to a value larger enough to avoid saturation.

13 Claims, 5 Drawing Figures

Fig_2_

TRANSISTOR AMPLIFIER

The present invention relates to the biasing of transistors to have smaller emitter-to-collector potentials, while at the same time avoiding saturation, and more particularly, to the use of transistors so biased in amplifiers which can have their input signals referred to one of their power supply potentials.

An older generation of integrated circuit operational amplifiers were designed to be powered with positive and negative power supply potentials as referred to a reference potential against which the operational amplifier input terminals were biased. These designs required a pair of regulated power supplies for supplying the two-opposite-polarity power supply potentials, and the input signals had to be maintained within a range between and not including the positive and negative power supply potentials in order not to disrupt proper amplifier action. Alternatively, if a single power supply were used, the input terminals of the operation amplifier had to be biased by potential dividing means. Input signal could not swing up to or past the range of potential afforded by the single power supply without interfering with proper amplifier action.

One of the primary desires when using integrated circuitry is to reduce the amount of external circuitry. This can result in economy, reliability and reduction of the bulk of the apparatus. So, it is desired to have an operational amplifier capable of being operated from a single power supply and of having its input terminals biased against one of the power supply potentials.

The present invention is embodied in a pair of junction transistors of complementary conductivity type connected collector-to-collector. One of the transistors, an "active load transistor," has its emitter electrode connected to a reference potential and is biased to have a quiescent collector-to-emitter potential substantially smaller than its quiescent base-to-emitter potential but large enough so that the transistor is not in saturation. The other transistor is operated as a collector loaded amplifier transistor, its collector loading including the collector-to-emitter path of the active-load transistor, and may have its base potential as referred to said reference potential operated over a range including said reference potential. That is, the base potential of the collector-loaded amplifier transistor can be of the same polarity as the base potential of the active load transistor. But, also, the base potential of the collector-loaded amplifier may be of the opposite polarity as the base potential of the active load transistor over a limited range. Where the emitter-to-collector potential of the active load transistor approaches its saturation value this limited range can be nearly as large as the potential across the collector-to-base junction of the collector-loaded amplifier transistor were it to be forward biased minus the larger of the collector-to-emitter potentials to the two transistors at the onset of its saturation condition. In a silicon transistor, this limited range can be as large as five to six hundred millivolts, for example. This permits the base potential of the collector-loaded amplifier to have a quiescent value substantially equal to the reference potential and to exhibit swings about that reference potential, if desired, and gives new freedom of amplifier design, particularly where only a single power supply is to be used.

In the drawing:

FIGS. 1, 2, 3, 4, and 5 are schematic diagrams of different cascade connections of differential amplifiers, each connection being an embodiment of the present invention.

FIG. 1 shows an amplifier 100 wherein a pair of input terminals 101 and 102 are linked to a pair of output terminals 103 and 104 by a cascade connection of: an emitter-coupled differential amplifier comprising similar PNP transistors 105 and 106; a pair of similar potential translating networks comprising respectively elements 107, 109 and elements 1108, 110; and an emitter-coupled differential amplifier comprising similar NPN transistors 111 and 112. The variations of the base currents of transistors 105 and 106 caused by differential input signal applied between terminals 101 and 102 are amplified to appear as variations of the collector currents of transistors 105 and 106. These collector current variations are coupled via potential translating networks respectively comprising elements 107, 109 and elements 108, 110 to be applied as variations in base current to transistors 111 and 112. These variations in the base currents of transistors 111 and 112 are again amplified to appear as variations of the collector currents of transistors 111 and 112. These twice-amplified current variations are made available at terminals 103 and 104 for coupling to subsequent circuitry.

Amplifier 100 operates with single power supply, shown as a battery 115, having its negative terminal connected to provide a ground reference potential. The quiescent potential of each of the input terminals 101 and 102 is shown as being established at ground reference potential by means of resistor 117 and resistor 118, respectively. This permits the application of push-pull input signals from sources 119 and 120, respectively, via coupling capacitors 121 and 122, respectively, to input terminals 101 and 102, respectively, of amplifier 100. Alternatively, one of the terminals 101 and 102 may be grounded and input signal applied only to the other, in single-ended fashion. Also, the terminals 101 and 102 may be biased to a common-mode potential mode positive than ground reference potential, approaching the supply potential provided at the positive terminal of supply 115 to within the forward-bias potential on the base-emitter junctions of transistors 105 and 106, plus the operating potential required for the current supply 123 connecting the joined emitter electrodes of transistors 105 and 106 to the positive terminal of supply 115.

The current supplies 125 and 126 are preferably identical in characteristics, as are current supplies 127 and 128. These current supplies 125–128 and current supply 123 may comprise constant current supplies each provided, for example, by the emitter-to-collector path of a PNP transistor provided with constant base-emitter bias potential. Also, rather than being provided by active elements, the current supplies 123, 125–127 may simply comprise direct current conductive impedance means such as resistors. Current supply 125 maintains Schottky diode 109 and the base-emitter junction of transistor 107 forward-biased. Current supply 126 similarly maintains Schottky diode 110 and the base-emitter junction of transistor 108 forwardbiased.

If only single-ended output signals are required, one of the current supplies 127 and 128 may be replaced by a direct connection. Or current supplies 127 and 128 may be replaced by, respectively, the input and output circuits of a current mirror amplifier used for constructively combining the collector current variations of transistors 111 and 112.

The collector electrodes of PNP transistors 105 and 106 are connected to the collector electrodes of NPN transistors 131 and 132, respectively. The grounded-emitter NPN transistors 131 and 132 are arranged to provide active collector loads for PNP transistor 105 and 106 with their base electrodes connected in common-mode negative feedback from the joined emitter electrodes of transistors 111 and 112. Due to this common-mode negative feedback, the collector electrodes of transistors 131 and 132 present a relatively low impedance for common-mode components of the collector currents of transistors 105 and 106. Insofar as differential-mode variations of the collector currents of transistors 105 and 106 are concerned, however, transistors 131 and 132 are biased for constant current operation, and so the collector electrodes of transistors 131 and 132 present a relatively high impedance to those differential-mode variations of the collector currents of transistors 105 and 106.

The first loop of the common-mode feedback begins at the interconnected collector electrodes of transistors 105 and 131, continues by emitter-follower action of transistor 107 and through Schottky barrier diode 109 to the base electrode of transistor 111, continues by emitter-follower action of transistor 111 to the base electrode of transistor 131, and is completed by the common-emitter amplifier action of transistor 131. The second loop of the common-mode feedback begins at the interconnected collector electrodes of transistors 106 and 132, continues by emitter-follower action of transistor 108 and through Schottky barrier diode 110 to the base electrode of transistor 112, continues by emitter-follower action of transistor 112 to the base electrode of transistor 132, and is completed by the common-emitter amplifier action of transistor 132. The common connection of the emitter electrodes of transistors 111 and 112 to the base electrodes of transistors 131 and 132 causes differential mode variations of the emitter currents of transistors 111 and 112 to be destructively combined--that is, cancelled-insofar as being applied to the base electrodes of transistors 131 and 132 is concerned. This is why these negative feedback loops are inoperative for differential-mode signals.

The current supply 123 determines the combined emitter currents of transistors 105 and 106. The collector current of each of the transistors 105 and 106 is related to its emitter current by a factor $\alpha$, the common-base current gain of the transistor, which gain approaches a magnitude of unity or one. The common-mode collector currents of transistors 105 and 106 are equal in magnitude. The common mode feedback adjusts the base-emitter potentials of transistors 131 and 132 to condition them to accept the common-mode collector currents of transistors 105 and 106, respectively.

The feature of the common mode feedback loop which is of particular interest is that it maintains the quiescent potentials $V_{B107}$ and $V_{B108}$ of the respective base electrodes of transistors 107 and 108 close to ground reference potential, but not so close as to cause saturation of transistors 131 and 132.

$$V_{B107} = V_{BE131} + V_{BE111} - V_{109} - V_{BE107}, \text{ and } V_{BE108} = V_{BE132} + V_{BE112} - V_{110} - B_{VE108},$$

where $V_{BE}$ is base-emitter potential of the transistor, having a number corresponding to the subscript, which is about 0.65 volt for the levels of current encountered in amplifiers of this type. $V_{109}$ and $V_{110}$ are the Schottky barrier potentials of diodes 109 and 110, respectively, which are about 0.3 volts. Accordingly, $V_{B107}$ and $V_{B108}$ are each about 0.35 volts with respect to ground reference potential. This is well about the 0.1 volts saturation potential of transistors 131 and 132.

Also, this keeps transistors 105 and 106 out of saturation when their base electrodes are biased against ground. Their emitter electrodes will be about 0.65 volts more positive than ground potential for such biasing conditions, so transistors 105 and 106 will have about 0.3 volts collector-to-emitter potential.

Important to the present invention is the realization that the emitter-to-collector potential of a transistor can be less than its emitter-to-base potential without the transistor saturating. That is, there is a range wherein amplifying action similar to that of a conventionally biased transistor obtains despite the emitter-to-collector potential of the transistor being less than its emitter-to-base potential. This range includes emitter-to-collector potentials about half as large as the normal range of transistor emitter-to-base potentials. It is this fact which permits operation of a collector-to-collector connection of complementary conductivity transistors with the base of one biased to substantially the same quiescent potential as the emitter of the other.

The common-mode feedback maintains the base-emitter potentials of transistors 131 and 132 at values characteristic of a collector current level substantially half that supplied by current source 123. This potential as applied to the base-emitter junction of transistor 133 will cause it to have collector current related to the collector currents of transistors 131 and 132 in substantially the same ratio as the effective area of the base-emitter junction of transistor 133 to that of transistors 131 or 132. This collector current demand of transistor 133 will be withdrawn as the combined emitter currents of transistors 111 and 112. (This connection facilitates scaling of the currents supplied by current supplies 127 and 128 to substantially equal the quiescent collector currents of transistors 111 and 112, respectively, when these supplies are provided by active circuitry. This scaling can then be done indirectly by scaling current supplies 127 and 128 to current supply 123.) The regulated potential appearing at the emitter electrodes of transistors 111 and 112 can alternatively be applied to a resistor, rather than to transistor 133, to establish the level of the combined emitter currents of transistors 111 and 112.

Figure 2:
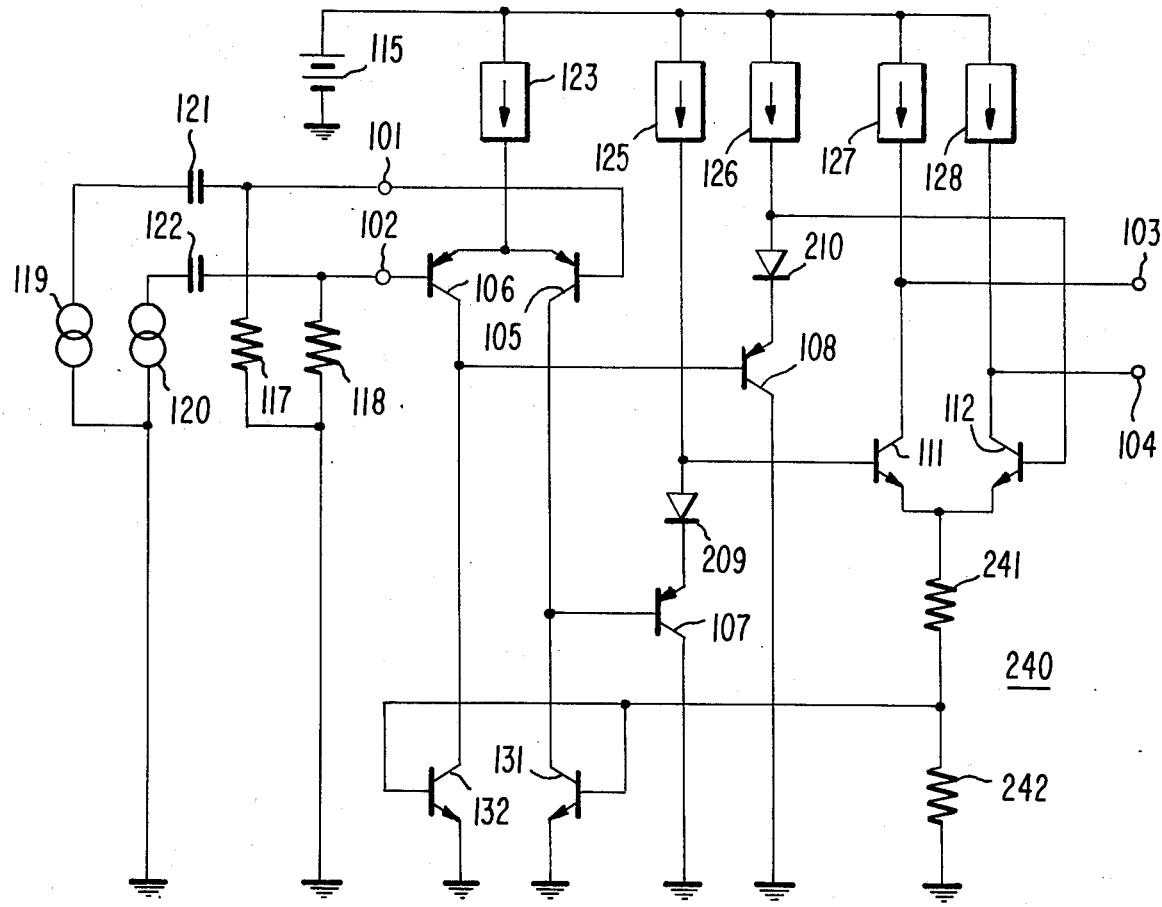

FIG. 2 shows an amplifier 200 similar to amplifier 100, but wherein Schottky diodes 109 and 110 are replaced by forward-biased junction diodes 209 and 210, respectively. To prevent saturation of transistors 131 and 132, the emitter potentials of transistors 111 and 112 are lifted more positive. This lifts the potentials at the base electrodes of transistors 111 and 112 and at the anodes of diodes 209 and 210, respectively. This lifts the potentials at the cathodes of diodes 209 and 210 (offset about 0.65 volts each from their respective anode potentials), which lifts the potentials at the emitter electrodes of transistors 107 and 108, respectively. The base electrodes of transistors 107 and 108 are lifted correspondingly.

The lifting of these potentials is accomplished by introducing a resistive potential divider 240, comprising resistors 241 and 242, between the interconnection of the emitter electrodes of transistors 111 and 112 and the interconnection of the base electrodes of transistors 131 and 132. The resistance of the divider elements is chosen low compared to the combined base impedances of transistors 131 and 132. The common mode feedback loop will regulate the potential at the output of the potential divider as applied to the base-emitter junctions of transistors 131 and 132 to a value such as to condition them to accept as collector currents the collector currents of transistors 105 and 106, respectively, just as in the FIG. 1 amplifier.

Accordingly, the joined emitter electrodes of transistors 111 and 112 are regulated to a potential larger than the 0.65 volt or so potential at the output of the potential divider by a factor which is the inverse of its output to input potential ratio. This latter ratio is well known to be $R_{242}/(R_{241} + R_{242})$, where $R_{241}$ and $R_{242}$ are the respective resistances of resistors 241 and 242. By choosing $R_{242}$ about one half so large as $R_{241}$, the emitter electrodes of transistors 111 and 112 are lifted to about 1 volt. This provides about optimum biasing of the base electrodes of transistors 107 and 108 at about 0.3 volts more positive than ground reference potential. By changing the ratio of $R_{241}$ and $R_{242}$ to adjust the potential division ratio of potential of divider 240, these potentials can be adjusted upward or downward. In amplifier 200, $V_{B107}$ and $V_{B108}$, the base potentials of transistors 107 and 108 are described by the following equations.

$$V_{B107} = \left(\frac{R_{241} + R_{242}}{R_{242}}\right) V_{BE131} + V_{BE111} - V_{209} - V_{BE107}.$$

$$V_{B108} = \left(\frac{R_{241} + R_{242}}{R_{242}}\right) V_{BE132} + V_{BE112} - V_{210} - V_{BE108}.$$

$V_{209}$ and $V_{210}$ are the potential drops across forward-biased diodes 209 and 210, respectively.

$R_{241} + R_{242}$ is chosen so, by Ohm's Law, the 1 volt potential drop thereacross causes the desired level of the combined emitter currents of transistors 111 and 112.

Diodes 209 and 210 are shown as simple junction diodes, but may actually comprise transistors connected as diodes. For instance, an NPN transistor may have its base and collector electrodes connected to provide an "anode" for its emitter electrode "cathode."

Figure 3:
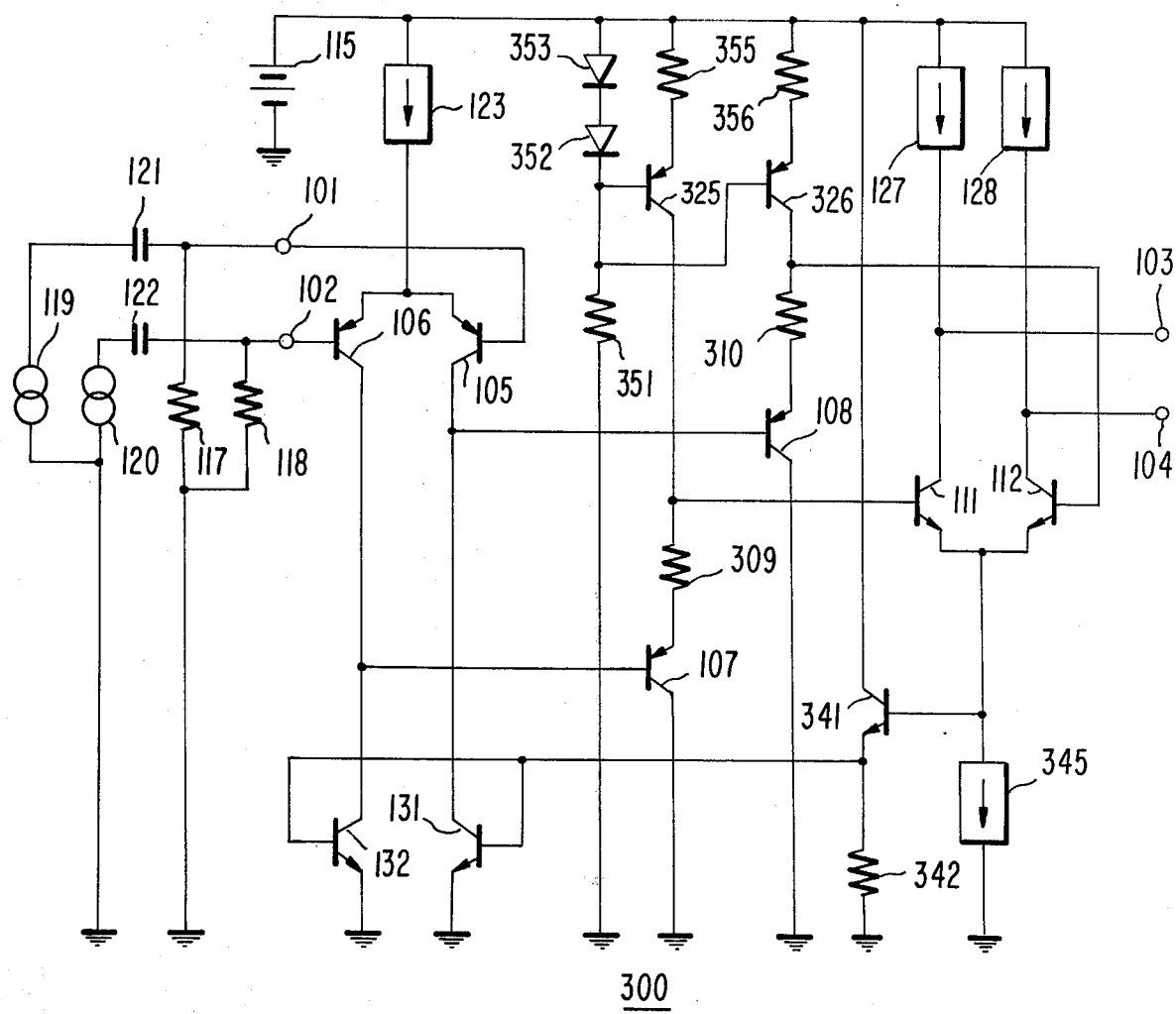

FIG. 3 shows an amplifier 300 similar to amplifier 200. Potential divider 240 is, however, replaced by an emitter follower transistor 341 with emitter resistor 342. Accordingly, the common-mode feedback regulates the joined emitter electrodes of transistors 111 and 112 to a potential equal to the sum of the base-emitter offset potentials of transistor 341 and of either of transistors 131 and 132. This places the base electrodes of transistors 111 and 112 at $V_{B111}$ and $V_{B112}$ potentials defined by the following equations.

$$V_{B111} = V_{BE131} + V_{BE341} + V_{BE111} \quad V_{B112} = V_{BE132} + V_{BE341} + V_{BE112}$$

To place the base electrodes of transistors 107 and 108 at potentials $V_{B107}$ and $V_{B108}$ equal to about 0.5 $V_{BE131}$ and 0.5 $V_{BE132}$, respectively, a potential drop of about 1.5 $V_{BE}$, or 1 volt, needs to be developed across each of the resistors 309 and 310, to augment the $V_{BE107}$ and $V_{BE108}$ potential offsets across the base-emitter junctions of transistors 107 and 108. These 1.5 $V_{BE}$ potential drops are developed by causing properly valued collector currents to flow from transistors 325 and 326.

One way of doing this is shown. A bleeder resistor 351 is used to forward-bias diodes 353 and 352 to develop a 2$V_{BE}$ potential across these diodes. The emitter-follower action of transistors 325 places a 1$V_{BE}$ potential across resistor 355, and the emitter-follower action of transistor 326 places a 1$V_{BE}$ potential across resistor 356. The emitter currents of transistor 325 and 326 are determined according to Ohm's Law to be $1V_{BE}/R_{355}$ and $1V_{BE}/R_{356}$, respectively where $R_{355}$ and $R_{356}$ are the resistances of resistors 355 and 356. The collector currents of transistors are $\alpha$ times as large as their respective emitter currents; for integrated-circuit lateral PNP transistors common base current gain $\alpha_{PNP}$ does not approach unity closer than about 0.9 because of parasitic transistor action to the substrate. Nonetheless, the collector currents as a ratio of emitter currents can be accurately predicted. By making the resistance $R_{309}$ of resistor 309 equal to 1.5 $R_{355}/\alpha_{PNP}$, and the resistance $R_{310}$ of resistor 310 equal to 1.5 $R_{356}/\alpha_{PNP}$, 1.5$V_{BE}$ potential drops will be developed across each of the resistors $R_{309}$ and $R_{310}$. Increasing the ratios $R_{309}/R_{355}$ and $R_{310}/R_{356}$ will decrease the potentials $V_{BE107}$ and $V_{BE108}$ at the base electrodes of transistors 107 and 108, respectively; decreasing the ratios will increase $V_{B107}$ and $V_{B108}$, respectively.

Alternatively, resistor 309 may be replaced by a forward-biased diode serially connected with a resistor with resistance 0.5 $R_{355}/\alpha_{PNP}$. A 1$V_{BE}$ offset potential will be developed across the diode, and a 0.5 $V_{BE}$ potential drop will be developed across the resistor. Similarly, resistor 310 may be replaced by a forward-biased diode serially connected with a resistor with resistance 0.5 $R_{356}/\alpha_{PNP}$. An advantage of the FIG. 3 circuit and this alternative is that the combined emitter currents of transistors 111 and 112 may be determined by current supply 345 being made a constant current supply, rather than a resistor.

Another alternative to the FIG. 3 circuit has the joined electrodes of transistors 111 and 112 directly connected to the base electrodes of transistors 131 and 132. as in the FIG. 1 circuit and resistors 309 and 310 of such value that a potential drop substantially equal to 0.5 $V_{BE}$ appears across each of them.

Figure 4:
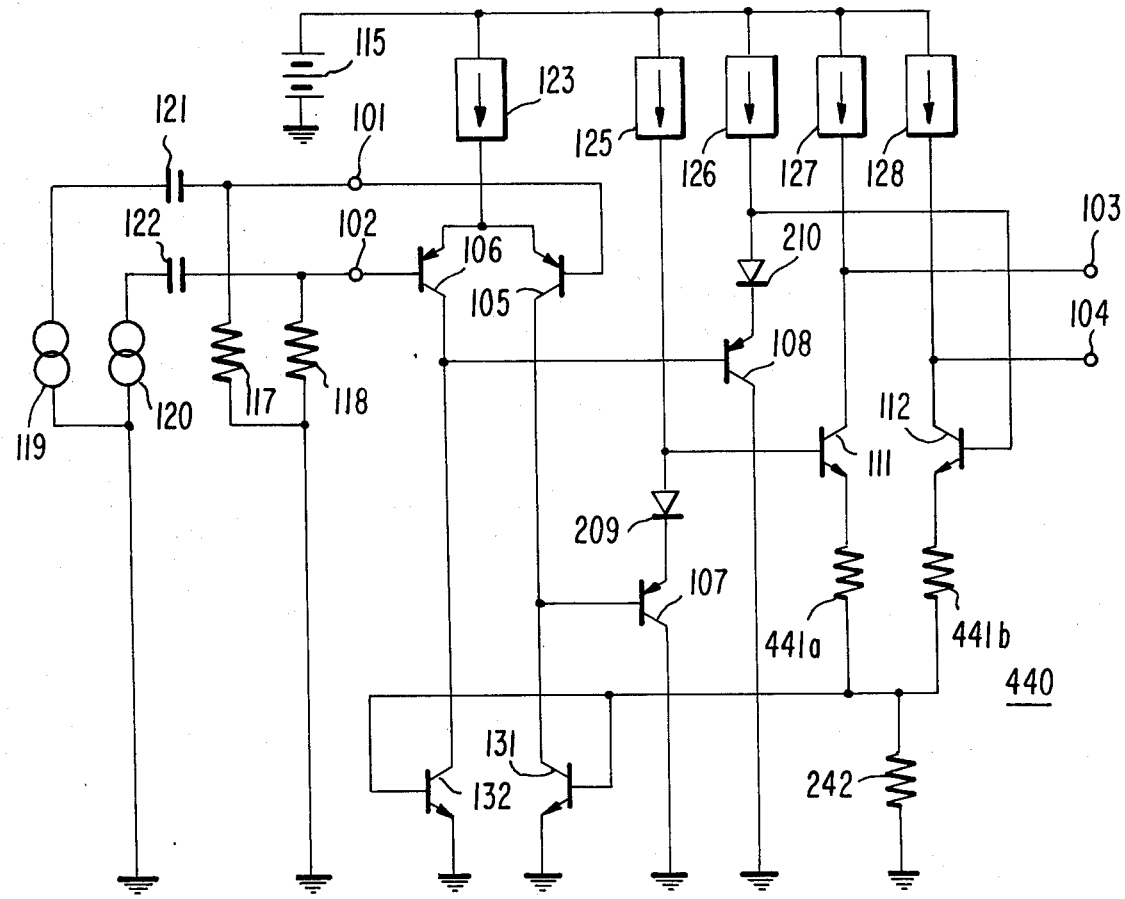

FIG. 4 shows a variation of the FIG. 2 configuration which is useful when the levels of signal being amplified exceeds 0.1 or 0.2 volts peak-to-peak at the base electrodes of transistors 111 and 112. The resistor 241 of the FIG. 2 circuit is replaced by two resistors 441a and 441b having twice the resistance of resistor 241. The resistors 441a and 441b act as emitter degeneration resistances for transistors 111 and 112, respectively. A resistor connecting the emitter electrodes of transistors 111 and 112 can be used to reduce the amount of emitter degeneration or, alternatively, the pi-network formed by that extra resistor and resistors 441a and 441b may be replaced by an equivalent tee-network.

Figure 5:
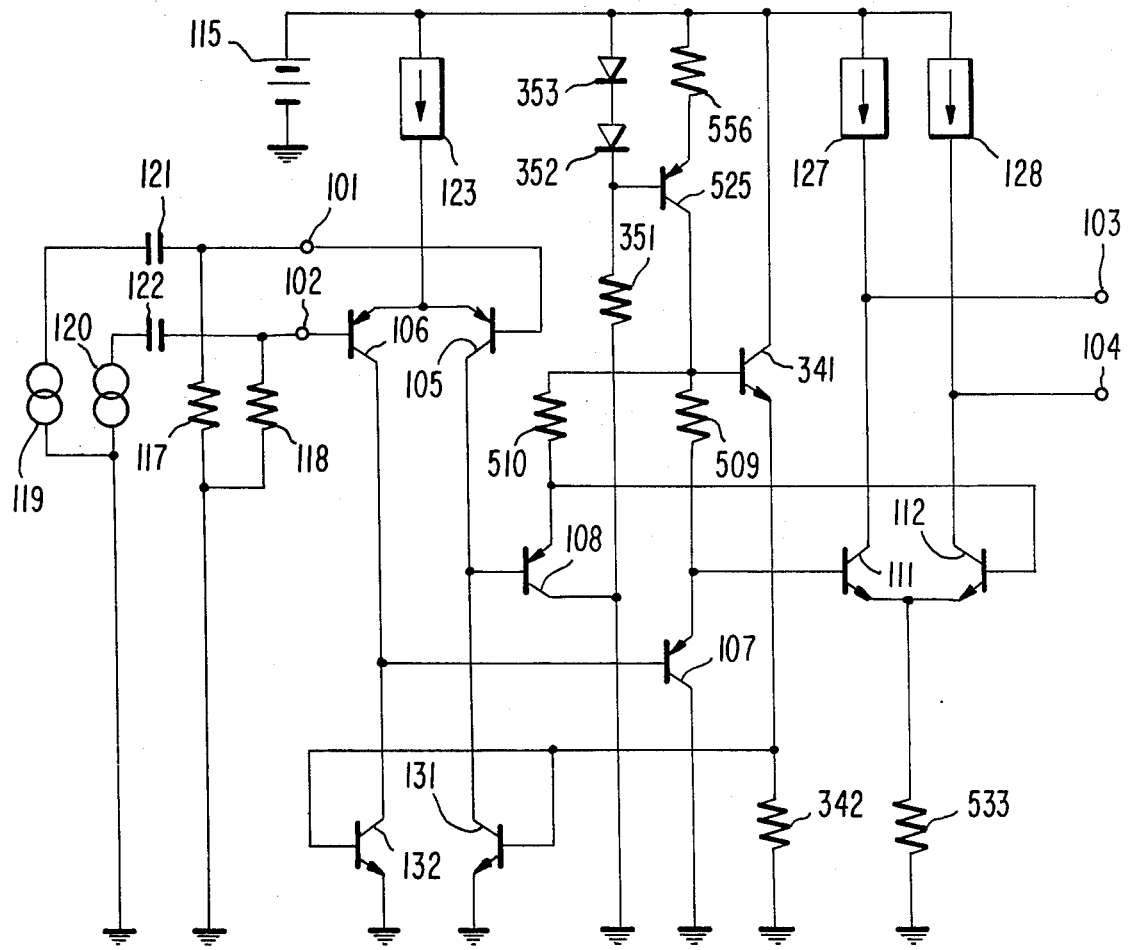

FIG. 5 shows how the summing point for the common-mode feedback can be moved to a point before the joined emitter electrodes of transistors 111 and 112. Resistors 509 and 510 are made to have resistances substantially one-half that of resistor 556, so they have about 0.5 $V_{BE}$ potential drop across them. The common-mode feedback maintains 1$V_{BE}$ across the base-emitter junctions of transistors 131 and 132. The 1$V_{BE}$ drop across the base-emitter junction of transistor 341 is added to this, to place a 2$V_{BE}$ potential at the interconnections of resistors 509 and 510. The 0.5 $V_{BE}$ potential drop across resistors 509 and 510 place the quiescent potentials of the emitter electrodes of transistors 107 and 108 and the base electrodes of transistors 111 and 112 at 1.5 $V_{BE}$. The offset potentials of their base-emitter junctions then cause the base electrodes of transistors 107 and 108 to be at 0.5 $V_{BE}$ quiescent potentials. Since the transistors 111 and 112 are not in the common-mode feedback loop, one or the other of them may be dispensed with where only a single-ended output is required.

The representative embodiments of the invention shown in the FIGURES share certain common features. The emitter-coupled input differential amplifier transistors 111 and 112 are connected collector-to-collector with common-emitter transistors 131 and 132, respectively, which are of a complementary conductivity type with emitter electrodes connected to a reference potential. There is a potential translation from each of the collector-to-collector connections to a potential sufficiently removed from the reference potential that connection to an ensuing amplifier stage is possible, then a subsequent potential translation in the opposite direction to the base electrodes of transistors 131 and 132. This completes a pair of degenerative feedback loops connected at a point in the potential translation networks so as to make them operative only for common-mode signals. The degenerative feedback maintains a $V_{BE}$ offset potential on the complementary-conductivity transistors 131, 132 to condition them to have collector currents equal respectively to the collector currents of the input differential amplifier transistors 105, 106 to which they are joined in collector-to-collector connections. The potential translations away from reference potential following the collector-to-collector connections being larger by a few tenths of a volt than the potential-translations back toward reference potential for connection to the base electrodes of transistors 131 and 132, this places the collector electrodes of transistors 131 and 132 at a quiescent potential with respect to their emitter electrodes just slightly larger than saturation potential.

This permits the input differential amplifier transistors to have base potentials which can range not only positively with respect to the reference potential, but also over a limited range, negatively. This is accomplished without the need for potential translating elements such as common-collector or emitter follower transistors to connect ground-biased input terminals 101 and 102 to the base electrodes of the emitter-coupled differential amplifier transistors 105 and 106. Noise and input offset potential errors attributable to such devices are thus avoided.

What is claimed is:

1. The combination of:

first and second transistors of opposite conductivity types, each of said first and said second transistors having base and emitter electrodes with a base-emitter junction therebetween and having a collector electrode connected to that of the other at an interconnection;

means for applying a reference potential to the emitter electrode of said first transistor;

means for applying a forward bias potential between the emitter and base electrodes of said first transistor;

means for maintaining a potential between the emitter and collector electrodes of said first transistor which has a quiescent value substantially one-half as large as that of said forward bias potential; and further means connecting said second transistor as an amplifier with collector loading, said further means including means for applying an input signal between the base and emitter electrodes of said second transistor, said input signal having a direct component associated therewith related to said reference potential.

2. The combination of:

first and second transistors of opposite conductivity types, each of said first and said second transistors having base and emitter electrodes with a base-emitter junction therebetween and having a collector electrode connected to that of the other at an interconnection;

a source of reference potential;

means for connecting the emitter electrode of said first transistor to said source such that its quiescent potential is substantially equal to said reference potential;

means for biasing the base electrode of said second transistor to a quiescent potential substantially equal to said reference potential;

means for applying quiescent forward bias potential to the base-emitter junction of said first transistor;

means for applying quiescent forward bias current to the base-emitter junction of said second transistor to develop a quiescent potential at its emitter electrode; and means for maintaining the quiescent potential at said interconnection at a level substantially midway between said reference potential and said quiescent potential at the emitter electrode of said second transistor.

3. A differential amplifier comprising:

first and second transistors of a first conductivity type, each having a base and an emitter and a collector electrode;

means for applying a quiescent bias potential at a reference potential level to the base electrodes of each of said first and said second transistors;

means for coupling the emitter electrodes of said first and said second transistors together;

means for supplying a quiescent emitter current to each of said first and said second transistors, thereby to develop a quiescent emitter potential for each of said first and said second transistors; and means for maintaining the quiescent collector potentials of each of said first and said second transistors substantially midway between its emitter potential and said reference potential level.

4. A differential amplifier as set forth in claim 3 wherein said means for maintaining the quiescent potentials of each of said first and said second transistors midway between its emitter potential and said reference potential includes:

third and fourth transistors of a second conductivity type complementary to said first conductivity type, each of said third and fourth transistors having an emitter and a base and a collector electrode;

means for applying a quiescent bias potential at said reference potential level to the emitter electrodes of each of said third and said fourth transistors;

a first interconnection, between the collector electrodes of said first and said third transistors;

a second interconnection between the collector electrodes of said second and said fourth transistors;

and means providing a common mode feedback connection from each of said first and said second interconnections to the base electrodes of said third and said fourth transistors.

5. A differential amplifier as set forth in claim 4 wherein said means providing a common-mode feedback connection comprises:

first means for translating potential connected between said first interconnection and a third interconnection and poled for making the potential at said third interconnection larger than the potential at said first interconnection with regard to said reference potential;

second means for translating potential connected between said second interconnection and a fourth interconnection and poled for making the potential at said fourth interconnection larger than the potential at said second interconnection with regard to said reference potential;

third means for translating potential, providing a potential translation smaller than that of said first means for translating potential by an amount $\Delta V$ larger than the collector-to-emitter saturation potentials of said third and fourth transistors, connected between said third interconnection and said third transistor base electrode and poled for making the potential at said third transistor base electrode smaller than the potential at said third interconnection with regard to said reference potential; and fourth means for translating potential, providing potential translation smaller than that of said second means for translating potential by an amount $\Delta V$, connected between said fourth interconnection and said fourth base electrode and poled for making the potential at said fourth transistor base electrode smaller than the potential at said fourth interconnection with regard to said reference potential.

6. A differential amplifier stage having:

first and second terminals for connection to a power supply;

third and fourth terminals for receiving an input signal;

first and second transistors of a first conductivity type, having respective emitter electrodes connected to a first node, having respective base electrodes respectively connected to said third terminal and to said fourth terminal, having respective collector electrodes respectively connected to a second node and to a third node;

direct current conductive means connecting said first terminal to said first node;

third and fourth transistors of a second conductivity type complementary to said first conductivity type, having respective base electrodes connected to a fourth node, having respective emitter electrodes directly connected to said second terminal, and having respective collector electrodes respectively connected to said second node and to said third node; and means providing common-mode feedback connecting each of said second and said third nodes to said fourth node including:

first means for translating potential, connected between said second node and a fifth node and poled for making the potential between said second terminal and said fifth node larger than the potential between said second terminal and said second node;

second means for translating potential connected between said third node and a sixth node and poled for making the potential between said second terminal and said sixth node larger than the potential between said second terminal and said third node;

third means for translating potential, providing potential translation smaller than that of said first means for translating potential by an amount $\Delta V$ larger than the collector-to-emitter saturation potentials of said third and said fourth transistors, connected between said fifth and said fourth nodes and poled for making potential between said second terminal and said fourth node smaller than the potential between said second terminal and said fifth node; and fourth means for translating potential, providing potential translation smaller than that of said second means for translating potential by an amount $\Delta V$, connected between said sixth and said fourth nodes and poled for making the potential between said second terminal and said fourth node smaller than the potential between said second terminal and said sixth node, $\Delta V$ being chosen to have a value substantially one-half that of the offset potentials applied between the base and emitter electrodes of each of said third and said fourth transistors by said common-mode feedback.

7. A differential amplifier stage as set forth in claim 6 having included therein:

fifth and sixth transistors of said first conductivity type and seventh and eighth transistors of said second conductivity type, each of these transistors having base and emitter electrodes with a base-emitter junction therebetween and having a collector electrode, the base electrodes of said fifth and said sixth and said seventh and said eighth transistors respectively connected to said second and said third and said fifth and said sixth nodes, the collector electrodes of said fifth and sixth transistors being connected to said second terminal, the emitter electrodes of said seventh and said eighth transistors being connected to said fourth node, the base-emitter junctions of said seventh and said eighth transistors corresponding respectively to said third and said fourth means for translating potential;

a first Schottky-diode connected between said fifth transistor emitter electrode and said fifth node and poled to form a series combination with said fifth transistor base-emitter junction, which series combination provides said first means for translating potential;

means for supplying current to said fifth node from said first terminal, poled to forward bias said first Schottky diode and the base-emitter junctions of said fifth and said seventh transistors;

a second Schottky diode connected between said sixth transistor emitter electrode and said sixth node and poled to form a series combination with said sixth transistor base-emitter junction, which series combination provides said second means for translating potential;

means for supplying current to said sixth node from said first terminal, poled to forward bias said second Schottky diode and the base-emitter junctions of said sixth and said eighth transistors;

means for supplying current to said seventh transistor collector electrode from said first terminal;

means for supplying current to said eighth transistor collector electrode from said first terminal; and output signal utilization means connected to at least one of the collector electrodes of said seventh and said eighth transistors.

8. A differential amplifier stage as set forth in claim 6 having included therein:

fifth and sixth transistors of said first conductivity type and seventh and eighth transistors of said second conductivity type, each of these transistors having base and emitter electrodes with a base-emitter junction therebetween and having a collector electrode, the base electrodes of said fifth and said sixth and said seventh and said eighth transistors respectively connected to said second and said third and said fifth and said sixth nodes, the collector electrodes of said fifth and sixth transistors being connected to said second terminal, the base-emitter junctions of said seventh and said eighth transistors being included respectively in said third and said fourth means for translating potential;

first and second resistive means having respective resistances in substantially 1:2 ratio, said first resistive means connecting the joined emitter electrodes of said seventh and said eighth transistors to said fourth node and being included in both said third and said fourth means for translating potentials, said second resistive means being connected between said fourth node and said second terminal;

a first junction diode connected between said fifth transistor emitter electrode and said fifth node and poled to form a series combination with said fifth transistor base-emitter junction, which series combination provides said first means for translating potential;

means for supplying current to said fifth node from said first terminal, poled to forward bias said first junction diode and the base-emitter junctions of said fifth and said seventh transistors;

a second junction diode connected between said sixth transistor emitter electrode and said sixth node and poled to form a series combination with said sixth transistor base-emitter junction, which series combination provides said second means for translating potential;

means for supplying current to said sixth node from said first terminal, poled to forward bias said second junction diode and the base-emitter junctions of said sixth and said eighth transistors;

means for supplying current to said seventh transistor collector electrode from said first terminal;

means for supplying current to said eighth transistor collector electrode from said first terminal; and output signal utilization means connected to at least one of the collector electrodes of said seventh and said eighth transistors.

9. A differential amplifier stage as set forth in claim 6 having included therein:

fifth and sixth transistors of said first conductivity type, and seventh and eighth transistors of said second conductivity type, each of these transistors having base and emitter electrodes with a base-emitter junction therebetween and having a collector electrode, the base electrodes of said fifth and said sixth and said seventh and said eighth transistors respectively connected to said second and said third and said fifth and said sixth nodes, the collector electrodes of said fifth and sixth transistors being connected to said second terminal, the base-emitter junctions of said seventh and said eighth transistors corresponding respectively to said third and said fourth means for translating potential;

first and second and third resistive means, said first and said second resistive means having equal resistances substantially equal to that of said third resistive means, said first resistive means connecting said seventh transistor emitter electrode to said fourth node and being included in said third means for translating potential, said second resistive means connecting said eighth transistor emitter electrode to said fourth node and being included in said fourth means for translating potential, said third resistive means being connected between said fourth node and said second terminal;

a first junction-diode connected between said fifth transistor emitter electrode and said fifth node and poled to form a series combination with said fifth transistor base-emitter junction, which series combination provides first means for translating potential;

means for supplying current to said fifth node from said first terminal, poled to forward bias said first junction diode and the base-emitter junctions of said fifth and said seventh transistors;

a second junction diode connected between said sixth transistor emitter electrode and said sixth node and poled to form a series combination with said sixth transistor base-emitter junction, which series combination provides said second means for translating potential;

means for supplying current to said sixth node from said first terminal, poled to forward bias said second junction diode and the base-emitter junction of said sixth and said eighth transistors;

means for supplying current to said seventh transistor collector electrode from said first terminal;

means for supplying current to said eighth transistor collector electrode from said first terminal; and output signal utilization means connected to at least one of the collector electrodes of said seventh and said eighth transistors.

10. A differential amplifier stage as set forth in claim 6 having included therein:

fifth and sixth transistors of said first conductivity type and seventh and eighth transistors of said second conductivity type, each of these transistors having base and emitter electrodes with a base-emitter junction therebetween and having a collector electrode, the base electrodes of said fifth and said sixth and said seventh and said eighth transistors respectively connected to said second and said third and said fifth and said sixth nodes, the collector electrodes of said fifth and said sixth transistors being connected to said second terminal, the emitter electrodes of said seventh and said eighth transistors being connected to said fourth node, the base-emitter junctions of said seventh and said eighth transistors corresponding respectively to said third and said fourth means for translating potential;

first resistive means connected between said fifth transistor emitter electrode and said fifth node to form a series combination with said fifth transistor base-emitter junction, which series combination provides said first means for translating potential;

means for supplying current to said fifth node from said first terminal, poled to forward bias the base-emitter junctions of said fifth and said seventh transistors, and proportional to cause a potential drop across said first resistive means substantially half so large as the potential drop it causes across the base-emitter junction of said fifth transistors;

second resistive means connected between said sixth transistor emitter electrode and said sixth node to form a series combination with said sixth transistor base-emitter junction which series combination provides said second means for translating potential;

means for supplying current to said sixth node from said first terminal, poled to forward bias the base-emitter junctions of said sixth and said eighth transistors, and proportioned to cause a potential drop across said second resistive means substantially half as large as the potential drop it causes across the base-emitter junction of said sixth transistor;

means for supplying current to said seventh transistor collector electrode from said first terminal;

means for supplying current to said eighth transistor collector electrode from said first terminal; and output signal utilization means connected to at least one of the collector electrodes of said seventh and said eighth transistors.

11. A differential amplifier stage having:

first and second terminals for connection to a power supply;

third and fourth terminals for receiving an input signal;

first and second transistors of a first conductivity type, having respective emitter electrodes connected to a first node, having respective base electrodes respectively connected to said third terminal and to said fourth terminal, having respective collector electrodes respectively connected to a second node and to a third node;

first direct current conductive means connecting said first terminal to said first node;

third and fourth transistors of a second conductivity type complementary to said first conductivity type, having respective base electrodes connected to a fourth node, having respective emitter electrodes directly connected to said second terminal, and having respective collector electrodes respectively connected to said second node and to said third node; and means providing common-mode feedback connecting each of said second and said third nodes to said fourth node including:

fifth and sixth transistors of said first conductivity type and a seventh transistor of said second conductivity type, each of these transistors having base and emitter electrodes with a base-emitter junction therebetween and having a collector electrode, the base electrodes of said fifth and said sixth transistors respectively connected to said second and said third nodes, the collector electrodes of said fifth and sixth transistors being connected to said second terminal, the emitter electrode of said seventh transistor being connected to said fourth node and the collector electrode of said seventh transistor being connected to said first terminal;

first and second resistive means having substantially equal resistances, said first resistance means being connected between said fifth transistor emitter electrode and said seventh transistor base electrode, said second resistive means being connected between said sixth transistor emitter electrode and said seventh transistor base electrode; and means for supplying current to the interconnection of said seventh transistor base electrode and said first and said second resistive means, poled to forward bias the base-emitter junctions of said fifth and said sixth and said seventh transistors.

12. A differential amplifier stage as set forth in claim 11 having another differential amplifier stage connected in direct-coupled cascade thereafter, said other differential amplifier stage including:

eighth and ninth transistors of said second conductivity type, each having base and emitter electrodes with a base-emitter junction therebetween and having a collector electrode, said eighth transistor base electrode being connected to said fifth transistor emitter electrode, said ninth transistor base electrode being connected to said sixth transistor emitter electrode;

second direct current conductive means connecting each of the base electrodes of said eighth and said ninth transistors to said second terminal;

third and fourth direct current conductive means respectively connecting the respective collector electrodes of said eighth and said ninth transistors to said first terminal, at least one of said second and said third direct current conductive means offering an impedance to an output signal developed thereacross.

13. A differential amplifier stage as set forth in claim 11 having in combination therewith;

an eighth transistor having a base electrode connected to the emitter electrode of one of said fifth and sixth transistors and having emitter and collector electrodes; and further means for connecting said eighth transistor as a common-emitter amplifier including second and third direct current conductive means respectively connecting the emitter and collector electrodes of said eighth transistor to separate ones of said first and second terminals.

* * * * *